(12) United States Patent
Sakai

(10) Patent No.: US 10,506,340 B2
(45) Date of Patent: Dec. 10, 2019

(54) DIGITAL SIGNAL PROCESSOR FOR AUDIO, IN-VEHICLE AUDIO SYSTEM AND ELECTRONIC APPARATUS INCLUDING THE SAME

(71) Applicant: ROHM CO., LTD., Ukyo-Ku, Kyoto (JP)

(72) Inventor: Mitsuteru Sakai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/401,424

(22) Filed: Jan. 9, 2017

(65) Prior Publication Data

US 2017/0201828 A1 Jul. 13, 2017

(30) Foreign Application Priority Data

Jan. 12, 2016 (JP) .................. 2016-003685

(51) Int. Cl.
| | |
|---|---|
| H03G 5/00 | (2006.01) |
| H03G 1/02 | (2006.01) |
| H03G 7/00 | (2006.01) |
| H03G 3/20 | (2006.01) |
| H04R 3/12 | (2006.01) |
| G06F 3/16 | (2006.01) |
| H03G 5/16 | (2006.01) |

(52) U.S. Cl.
CPC .............. *H04R 3/12* (2013.01); *G06F 3/165* (2013.01); *H03G 3/20* (2013.01); *H03G 5/005* (2013.01); *H03G 5/165* (2013.01); *H04R 2499/13* (2013.01)

(58) Field of Classification Search
CPC ..... G10L 21/0232; H03G 9/025; H03G 5/005

USPC .................. 381/98, 104–107, 103
See application file for complete search history.

(56) References Cited

U.S. PATENT DOCUMENTS

| | | | | | |
|---|---|---|---|---|---|
| 5,677,987 | A | * | 10/1997 | Seki ................... | H04R 3/02 381/83 |
| 5,892,833 | A | * | 4/1999 | Maag ................. | H04R 3/04 381/103 |
| 2007/0025559 | A1 | * | 2/2007 | Mihelich ............ | H04S 7/301 381/59 |

(Continued)

FOREIGN PATENT DOCUMENTS

JP 02250420 A 10/1990

*Primary Examiner* — George C Monikang
(74) *Attorney, Agent, or Firm* — Cantor Colburn LLP

(57) ABSTRACT

A digital signal processor for audio includes: an interface circuit communicating with an microcomputer; a multi-band equalizer including digital filters corresponding respectively to bands, wherein the frequency characteristic of each digital filter is changed according to coefficient group; a memory; and a coefficient setting circuit setting the coefficient group of each digital filter, wherein the frequency characteristic of the multi-band equalizer is selected from presets, wherein, when the digital signal processor start, the interface circuit receives setting data corresponding to the presets from the microcomputer and stores the received setting data in the memory, and wherein, at the time of audio reproduction, the interface circuit receives selection data to designate one of the plurality of presets and the coefficient setting circuit sets the coefficient group of each digital filter according to one of the setting data stored in the memory, the one setting data corresponding to the selection data.

6 Claims, 10 Drawing Sheets

(56) References Cited

U.S. PATENT DOCUMENTS

| | | | |
|---|---|---|---|
| 2007/0071246 A1* | 3/2007 | Miyagi | H03C 3/40 |
| | | | 381/15 |
| 2008/0107280 A1* | 5/2008 | Haulick | H04M 9/082 |
| | | | 381/66 |
| 2008/0253583 A1* | 10/2008 | Goldstein | H04R 1/1091 |
| | | | 381/92 |
| 2014/0270215 A1* | 9/2014 | Lin | G10H 1/0091 |
| | | | 381/61 |

* cited by examiner

BAND1

| g(dB) | $b_0$ | $b_1$ | $b_2$ | $a_0$ | $a_1$ |
|---|---|---|---|---|---|
| +9 | | | | | |
| +6 | | | | | |
| +3 | | | | | |
| 0 | | | | | |
| −3 | | | | | |
| −6 | | | | | |
| −9 | | | | | |
| −12 | | | | | | ively to a plurality of bands, wherein the frequency characteristic of each of the digital filters can be changed according to a coefficient group; a memory; and a coefficient setting circuit configured to set the coefficient group of each of the digital filters. The frequency characteristic of the multi-band equalizer can be selected from a plurality of presets. At the time of start of the digital signal processor, the interface circuit receives a plurality of setting data corre-
US 10,506,340 B2

DIGITAL SIGNAL PROCESSOR FOR AUDIO, IN-VEHICLE AUDIO SYSTEM AND ELECTRONIC APPARATUS INCLUDING THE SAME

CROSS-REFERENCE TO RELATED APPLICATION

This application is based upon and claims the benefit of priority from Japanese Patent Application No. 2016-003685, filed on Jan. 12, 2016, the entire contents of which are incorporated herein by reference.

TECHNICAL FIELD

The present disclosure relates to a digital signal processor for audio.

BACKGROUND

Audio equipment used for in-vehicle audio (car audio), home audio, portable audio and the like as a function of changing the frequency characteristic of the audio signal. For example, in a car audio product (or AV amplifier device), a user can select one from a plurality of equalizer settings corresponding to audio genres and musical instruments such as flat, rock, pops, vocals, piano, jazz, classical, etc. (preset equalizer) according to the user's preference. Alternatively, some car audio products have a function of reproducing spaces such as concert halls, jazz clubs, churches and the like (acoustic adjustment function). As another alternative, some car audio products have a function of correcting the frequency characteristic and phase characteristic of an audio signal reproduced from a speaker in accordance with a room sound field so as to obtain the optimal frequency characteristic and phase characteristic at a viewing position (also referred to as fixed equalizer or room correction). These are collectively referred to as frequency correction in this specification.

When such frequency correction is implemented by an analog circuit, the circuit scale becomes enormous. Therefore, a digital signal processor (DSP) is used to perform digital signal processing on a digital audio signal. FIG. 1 is a block diagram of an audio system including a DSP. The audio system 100 includes sound source 102, an analog amplifier 104, an A/D converter 106, a microcomputer 108, a DSP 110, a D/A converter 112, a volume circuit 114, a power amplifier 116 and an electroacoustic transducer 118.

The sound source 102 is a CD player, a DVD player, a silicon audio player, a smart phone or the like and outputs an analog audio signal. The analog amplifier 104 amplifies the analog audio signal from the sound source 102 and matches the amplified analog audio signal with an input range of the A/D converter 106 at the subsequent stage. Alternatively, a digital audio signal generated by the sound source 102 may be directly input to the DSP 110.

The DSP 110 receives a digital audio signal from the A/D converter 106 or the sound source 102 and performs a predetermined digital signal processing on the received digital audio signal. Examples of the signal processing by the DSP 110 may include stereo-monaural conversion, digital volume control and the like in addition to the above-described processing related to frequency correction.

The D/A converter 112 converts the digital audio signal processed by the DSP 110 into an analog audio signal. The volume circuit 114 amplifies an output signal of the D/A converter 112 with a gain corresponding to a volume value.

The power amplifier 116 amplifies an output of the volume circuit 114 and drives the electroacoustic transducer 118 such as a speaker or a headphone.

The microcomputer 108 integrally controls the audio system 100. The microcomputer 108 receives a command input by a user through a user interface such as a volume button or a touch panel, and controls the DSP 110 based on the command. The microcomputer 108 and the DSP 110 are interconnected via a bus or a control line. For example, upon detecting a volume change instruction input by the user, the microcomputer 108 transmits a command value of the gain of a digital volume circuit of the DSP 110 to the DSP 110.

FIGS. 2A and 2B are block diagrams related to the frequency correction of the DSP 110. As shown in FIG. 2A, the DSP 110 includes a multi-band equalizer 120 and an interface circuit 130 with the microcomputer 108. The multi-band equalizer 120 includes a plurality of M filters 122_1 to 122_M corresponding to the number of bands M. Upon detecting an equalizer change instruction input by the user, the microcomputer 108 transmits setting data of the filters 122_1 to 122_M.

FIG. 2B is a circuit diagram of the filter 122. This filter 122 is a second-order IIR (Infinite Impulse Response) filter, and its Q value, frequency f and gain can be set by a combination of five coefficients $b_0$ to $b_2$, $a_0$ and $a_1$.

The interface circuit 130 is, for example, an I²C (Inter IC) serial interface and can transmit data with 8 bits as one word. In a case where each coefficient is 24 bits (or 32 bits), in order to transmit five coefficients, it is necessary to transmit data of 24×⅝=15 times per band and, for M=13 bands, data transmission of 13×15=195 times is required.

Various data are always transmitted/received between the microcomputer 108 and the interface circuit 130. As one example, the audio system 100 has a function (spectrum analyzer function) for visually displaying the frequency spectrum of an audio signal being reproduced, and, during the reproduction of the audio signal, the microcomputer 108 reads out the signal strength of each band via the interface circuit 130 of the DSP 110. When data transmission for changing the setting of the equalizer is interrupted, data transmission for the spectrum analyzer is stopped each time, so that the correct frequency spectrum is not displayed. Particularly with the I²C interface, it is necessary to wait for an acknowledgment ACK after sending data from a master to a slave, which may cause an overhead.

SUMMARY

The present disclosure provides some embodiments of a digital signal processor for audio, which is capable of reducing the data amount and number of data transmission between a microcomputer and a DSP during audio reproduction.

According to one embodiment of the present disclosure, there is provided a digital signal processor for audio, including: an interface circuit configured to communicate with an external microcomputer; a multi-band equalizer which includes a plurality of digital filters corresponding respectively to a plurality of bands, wherein the frequency characteristic of each of the digital filters can be changed according to a coefficient group; a memory; and a coefficient setting circuit configured to set the coefficient group of each of the digital filters. The frequency characteristic of the multi-band equalizer can be selected from a plurality of presets. At the time of start of the digital signal processor, the interface circuit receives a plurality of setting data corremicrocomputer and stores the received plurality of setting data in the memory. At the time of audio reproduction, the interface circuit receives selection data to designate one of the plurality of presets and the coefficient setting circuit sets the coefficient group of each of the plurality of digital filters according to one of the plurality of setting data stored in the memory, the one setting data corresponding to the selection data.

All of the setting data corresponding respectively to the plurality of presets are transmitted from the microcomputer to the DSP at the time of start of the system and only the selection data is transmitted during audio reproduction. This makes it possible to reduce the data amount and number of data transmission during audio reproduction.

The setting data may include the coefficient group of each of the plurality of digital filters.

A frequency of each of the plurality of bands may be fixed, and the setting data may include a gain of each of the plurality of bands. The coefficient setting circuit may hold the correspondence between the gain and a coefficient group of the corresponding digital filter for each of the plurality of bands.

The digital signal processor may further include: a delay circuit which is disposed before or after the multi-band equalizer and is configured to provide a variable delay to an audio signal. The setting data may include a plurality of delay setting values corresponding respectively to the plurality of presets. At the time of audio reproduction, the coefficient setting circuit may set a delay amount of the delay circuit according to the delay setting values included in one of the plurality of setting data stored in the memory, the one setting data corresponding to the selection data.

With this configuration, it is possible to support presets using reverberation.

The digital signal processor may be integrated on a single semiconductor substrate.

As used herein, the term "integrated" is intended to include both of a case where all elements of a circuit are formed on a semiconductor substrate and a case where main elements of the circuit are integrated on the semiconductor substrate. In addition, some resistors, capacitors and the like for adjustment of a circuit constant may be provided outside the semiconductor substrate.

According to another embodiment of the present disclosure, there is provided an in-vehicle audio system including the above-described digital signal processor.

According to another embodiment of the present disclosure, there is provided an electronic apparatus including the above-described digital signal processor.

Any combinations of the above-described elements or changes of the representations or the elements of the present disclosure between methods, apparatuses and systems are effective as embodiments of the present disclosure.

DETAILED DESCRIPTION

Figure 1:
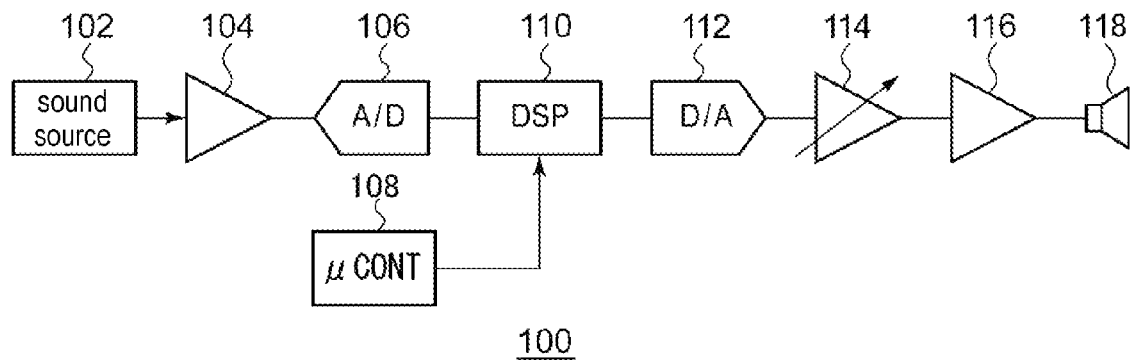
FIG. 1 is a block diagram of an audio system including a DSP.

Preferred embodiments of the present invention will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

In the specification, the phrase "connection of a member A and a member B" is intended to include direct physical connection of the member A and the member B as well as indirect connection thereof via other member as long as the other member has no substantial effect on the electrical connection of the member A and the member B. Similarly, the phrase "interposition of a member C between a member A and a member B" is intended to include direct connection of the member A and the member C or direct connection of the member B and the member C as well as indirect connection thereof via other member as long as the other member has no substantial effect on the electrical connection of the member A, the member B and the member C.

First Embodiment

Figure 3:
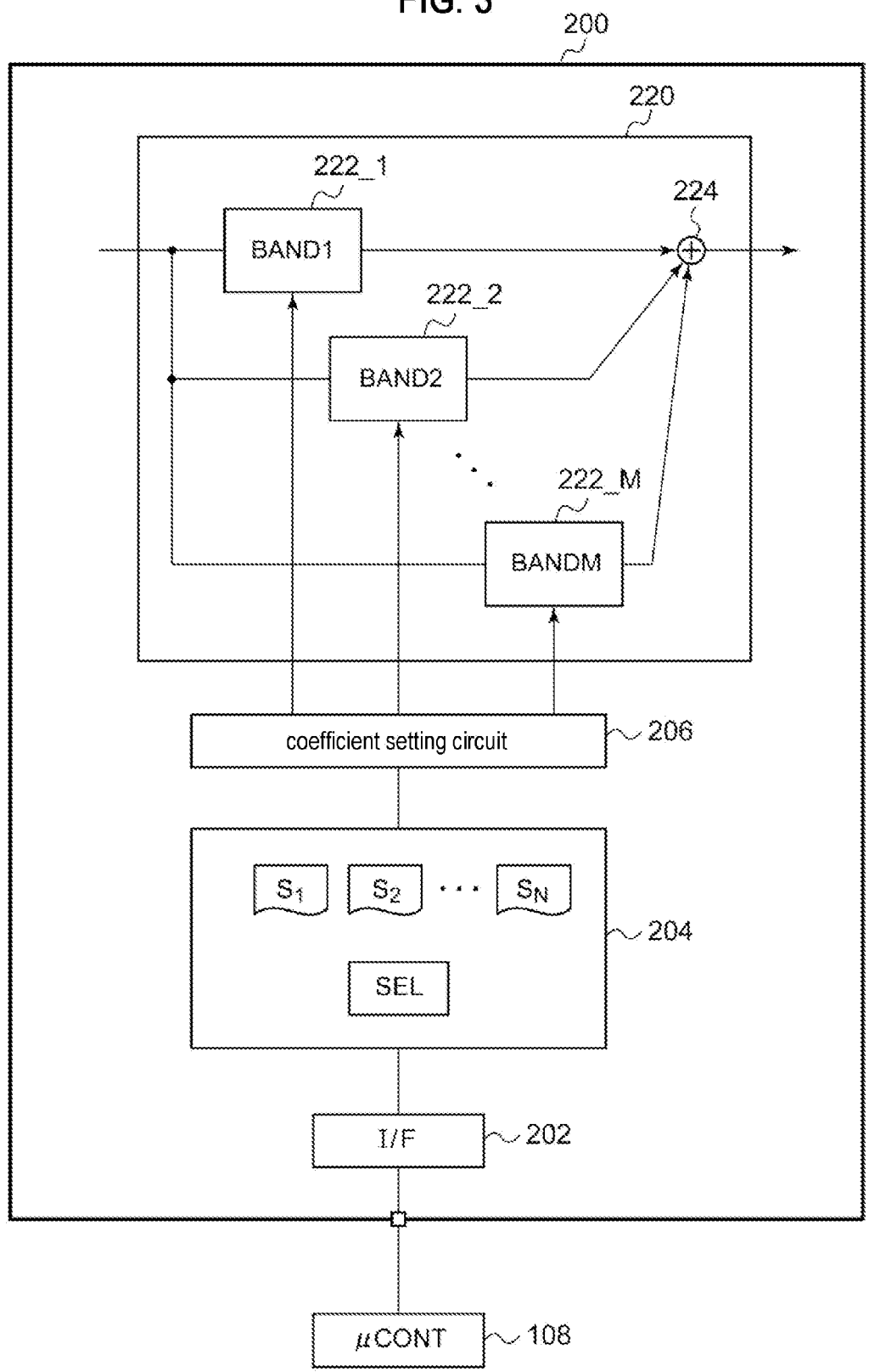
FIG. 3 is a block diagram of a DSP according to a first embodiment.

FIG. 3 is a block diagram of a DSP 200 according to a first embodiment. The DSP 200 performs various signal processing on a digital audio signal. For example, the DSP 200 can be used as the DSP 110 in the audio system 100 of FIG. 1.

The DSP 200 can change the frequency characteristic of the audio signal under control of an external microcomputer 108. The DSP 200 includes an interface circuit 202, a memory 204, a coefficient setting circuit 206 and a multi-band equalizer 220. The interface circuit 202 communicates with the external microcomputer 108. For example, the interface circuit 202 may be an I²C interface.

The multi-band equalizer 220 includes a plurality of digital filters 222_1 to 222_M corresponding to a plurality of M (M being an integer of 2 or more) bands BAND1 to BANDM. The frequency characteristic of each digital filter 222 can be changed according to a coefficient group. The digital filter 222 may be either an IIR (Infinite Impulse Response) filter or a FIR (Finite Impulse Response) filter. An adder 224 adds outputs of the plurality of M digital filters 222_1 to 222_M. The configuration of the multi-band equalizer 220 is not limited to that shown in FIG. 3. For example, the plurality of digital filters 222 may be connected in series. Alternatively, the multi-band equalizer 220 may be configured by a combination of serial connection and parallel connection of the plurality of digital filters 222.

Figure 2A:
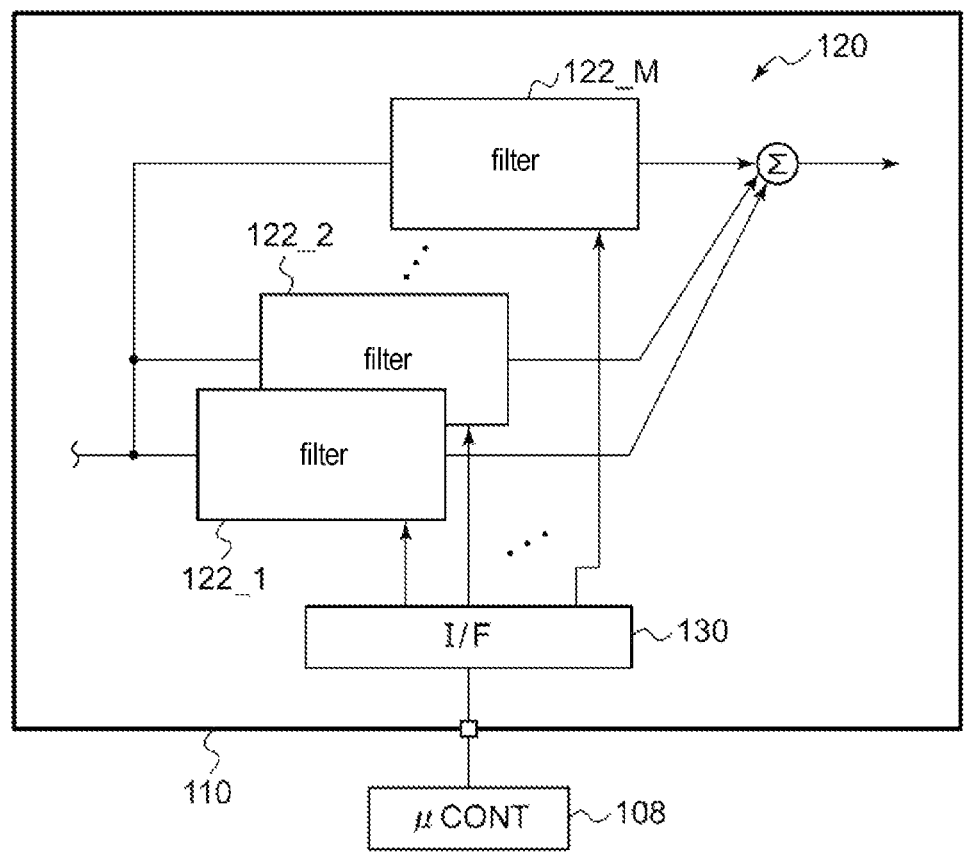
FIGS. 2A and 2B are block diagrams related to the frequency correction of the DSP.
Figure 2B:
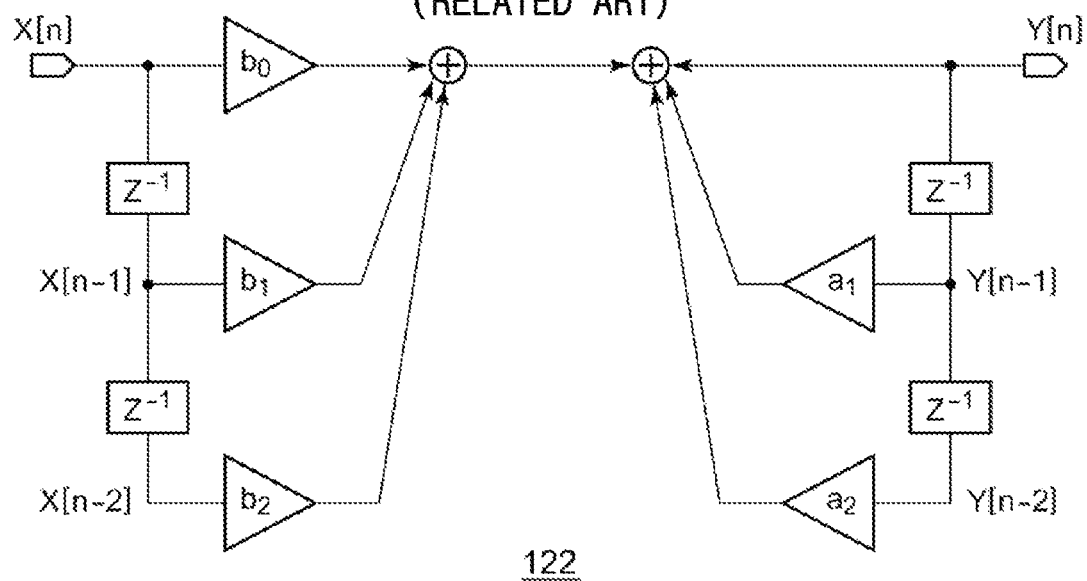

The coefficient setting circuit 206 sets a coefficient group of each of the plurality of digital filters 222_1 to 222_M. For example, when the digital filters 222 are the second-order IIR filters in FIG. 2B, the coefficient group includes five coefficients $b_0$ to $b_2$, $a_1$ and $a_2$.

The frequency characteristic of the multi-band equalizer 220 can be selected from a plurality of N (N being an integer of 2 or more) frequency characteristics (hereinafter referred to as "presets"). For example, a plurality of presets are prepared for each audio genre and musical instrument, such as flat, rock, pops, vocal, piano, jazz, classic, etc. Alternatively, the plurality of presets may be prepared for acoustic adjustment functions to reproduce reverberation of concert alls, jazz clubs, churches, etc. These presets may also contain components of equalization for room correction.

At the time of start of the DSP 200, the interface circuit 202 receives a plurality of setting data $S_1$ to $S_N$ corresponding respectively to the plurality of presets from the microcomputer 108 and stores them in the memory 204.

Then, at the time of audio reproduction, the interface circuit 202 receives selection data SEL to designate one of the plurality of presets. The coefficient setting circuit 206 sets the coefficient group of each of the plurality of digital filters 222_1 to 222_M according to one of the plurality of setting data $S_1$ to $S_N$ stored in the memory 204, which corresponds to the selection data SEL.

Figure 4:
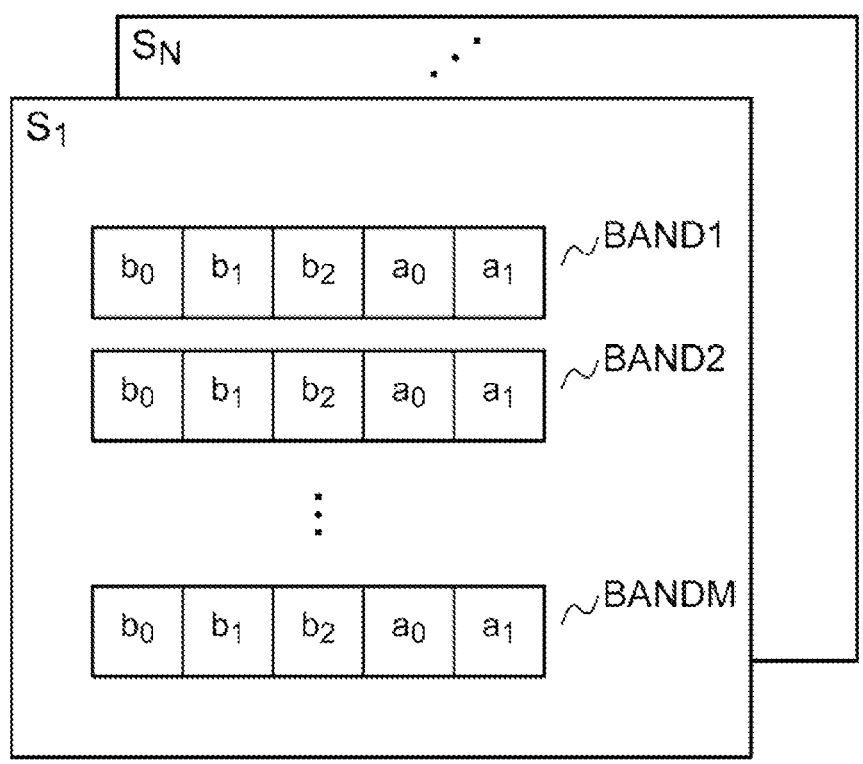
FIG. 4 is a view showing one example of setting data.

FIG. 4 is a view showing one example of the setting data. For example, the setting data $S_1$ may include a plurality of coefficient groups corresponding to the plurality of bands BAND1 to BANDM (that is, the plurality of digital filters 222). This is equally applied to other setting data $S_2$ to $S_N$.

Assume that a selection signal SEL to instruct an $i^{th}$ ($1 \leq i \leq N$) preset is written in the memory 204 during audio reproduction. At this time, the coefficient setting circuit 206 refers to $i^{th}$ setting data $S_i$ and sets a coefficient group of each hand included therein to the digital filter 222 of the corresponding band.

Figure 5:
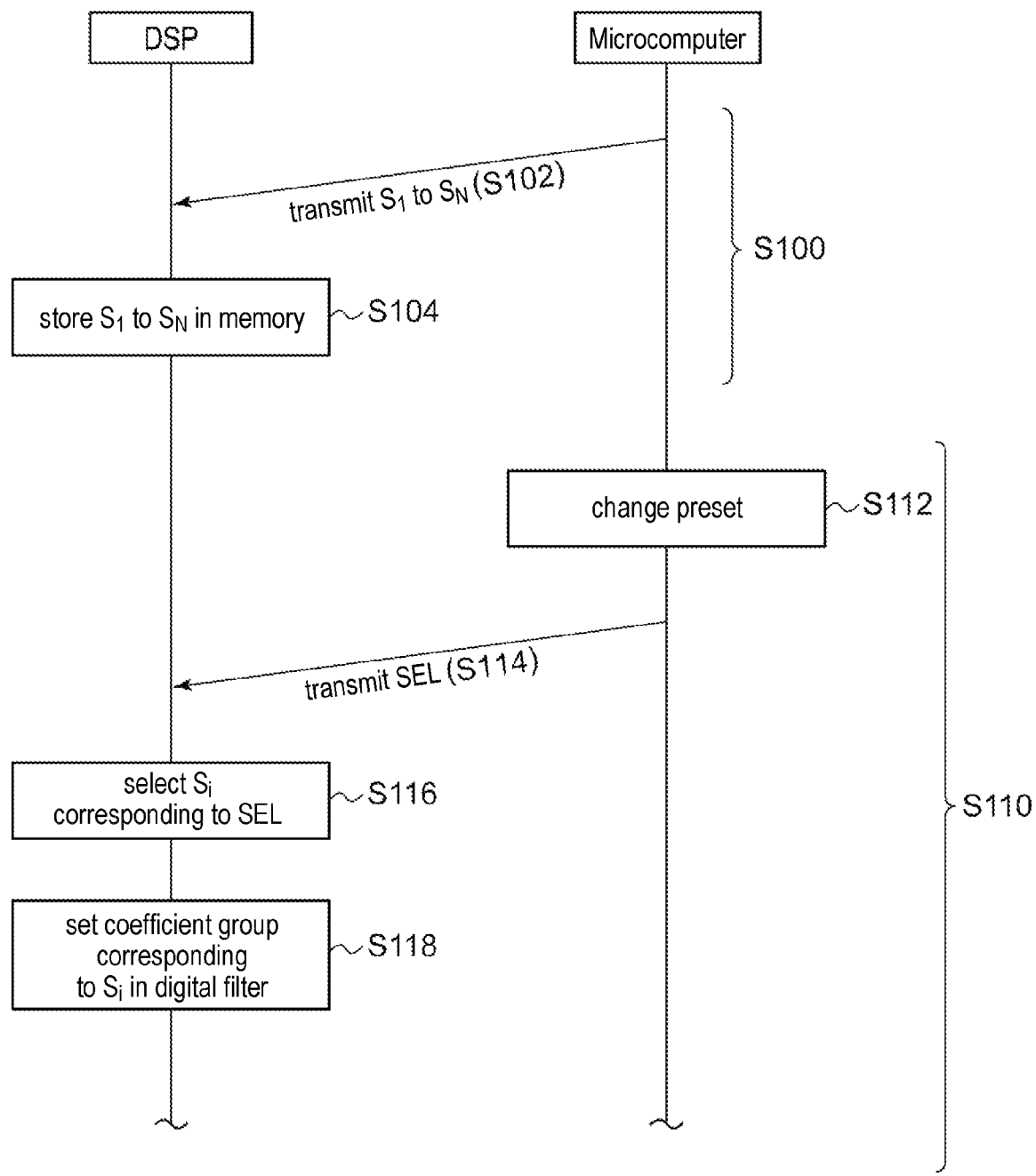
FIG. 5 is a sequence diagram of an audio system including a DSP.

The above is the configuration of e DSP 200. Subsequently, the operation thereof will be described. FIG. 5 is a sequence diagram of the audio system 100 including the DSP 200. Immediately after startup, a setup sequence S100 is executed. In the setup sequence S100, N setting data $S_1$ to $S_N$ corresponding respectively to the plurality of N presets are transmitted from the microcomputer 108 to the DSP 200 (S102). This transmission is a scheduled processing, not an interrupt processing. The interface circuit 202 of the DSP 200 stores the received N setting data $S_1$ to $S_N$ in the memory 204.

After completing the setup sequence, the microcomputer 108 initializes the coefficient groups of the plurality of digital filters 222 before proceeding to a reproduction sequence S110. For example, the DSP 200 holds an initial value (default value) of the preset and may initialize the multi-band equalizer 220 according to the initial value. Alternatively, the microcomputer 108 may transmit the initial value of the preset, as the selection data SEL, to the DSP 200 during the setup sequence.

Upon the completion of the setup sequence S100, the process proceeds to the reproduction sequence S110. During the reproduction sequence S110, the DSP 200 performs various signal processing (not shown in the sequence diagram of FIG. 5) on an audio signal. Further, during the reproduction sequence S110, the microcomputer 108 exchanges various data (not shown in the sequence diagram) with the DSP 200. For example, this exchange includes data transmission for spectrum analyzer function.

When the microcomputer 108 detects an input of change of the preset by a user during the reproduction sequence S110 (S112), the microcomputer 108 transmits the selection data SEL to designate the changed preset to the DSP 200 (S114).

The coefficient setting circuit 206 of the DSP 200 selects setting data $S_i$ corresponding to the preset designated by the selection data SEL (S116) and sets a coefficient group corresponding to the selected setting data $S_i$ in the digital filter 222 (S118). Thereafter, when the change of the equalizer is instructed again, the operations of S112 to S118 are performed.

The above is the operation of the audio system 100 including the DSP 200. According to the DSP 200, during the setup sequence, the setting data $S_1$ to $S_N$ corresponding to all the presets are transmitted and, during the audio reproduction, only the selection data SEL to designate the preset is transmitted. For example, when N (=8) presets are selectable, the selection data SEL may be 3 bits, so, when there is a change in the preset equalizer during audio reproduction, the preset can be switched with data transmission only once.

In contrast, in the setup sequence S100, the setting data $S_1$ to $S_N$ corresponding to all the presets are transmitted. As shown in FIG. 4, it is assumed that each setting data S includes a coefficient group for each band. In a system where a coefficient group contains 5 coefficients, each of which is 24 bits and M=13 bands, data of 12480 bits (=5×24 bits× M×N=5×24×13×8) are transmitted in the setup sequence S100. In a 1-word 8-bit serial interface, 1560 data transmissions occur. However, the data transmission in the setup sequence S100 is a scheduled processing rather than an interrupt processing. Therefore, this data transmission does not interfere with other data transmission and does not become a bottleneck of the processing of the DSP 200 or the microcomputer 108. In addition, since it is not necessary to consider the interrupt processing, the burden of software design is greatly reduced.

Second Embodiment

Figures 6A, 6B:
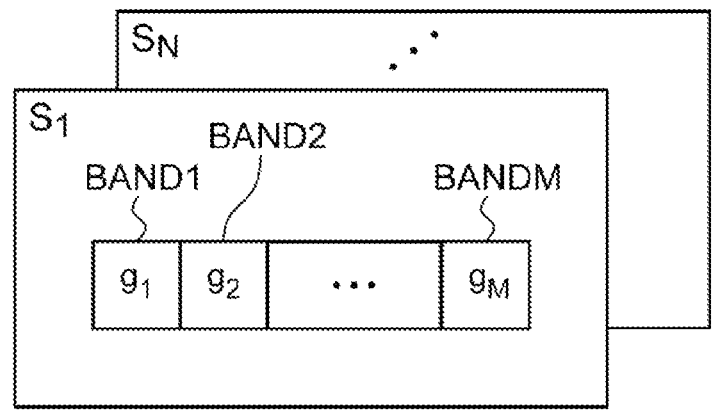
FIG. 6A is a view showing another example of the setting data.
FIG. 6B is a table showing the correspondence between a gain g and a coefficient group of a first band.

In the first embodiment, the frequencies of the plurality of bands BAND 1 to BANDM in the multi-band equalizer 220 are variable. Such an equalizer is also called a parametric equalizer. In a second embodiment, the frequency of each band is fixed. Such an equalizer is also called a graphic equalizer. For example, the frequencies of multiple bands are specified in the unit of octave. Then, in the multi-band equalizer 220, only the gain of each band is variable. FIG. 6A is a view showing another example of the setting data. The setting data $S_1$ in FIG. 6A includes the gains $g_1$ to $g_M$ of the respective bands BAND1 to BANDM. This is equally applied to other setting data $S_2$ to $S_N$.

The coefficient setting circuit 206 holds the correspondence between a gain g and a coefficient group of the corresponding digital filter 222 for each of the plurality of bands BAND 1 to BANDM. FIG. 6B is a table showing the correspondence between the gain g and the coefficient group of the first band BAND1. For example, a value of the gain g can be selected from 15 levels in the unit of 1 dB between −7 dB and +7 dB. A group of coefficients $b_0$ to $b_2$, $a_0$ and $a_1$ is held for each gain value. The specific values of the coefficients are omitted. This is equally applied to the other bands BAND2 to BANDM. The correspondence shown in FIG. 6B may be held as a table or may be held by an operational expression.

When the gain of each band can be set in 15 steps, the setting of the gain is 4 bits. According to the second embodiment, the setting data $S_1$ to $S_N$ transmitted in the setup sequence S100 are 416 bits (=4 bits×M×N=4×13×8). Therefore, when the 1-word 8-bit serial interface is used, data transmission of 52 times suffices, which is considerably reduced as compared with the first embodiment.

It may be said that the second embodiment is suitable for applications where the number of bands M is as large as 10 or more, whereas the first embodiment is suitable for applications where the number of bands M is 10 or less (or the number of bands M may be 5 or less).

Third Embodiment

Figure 7:
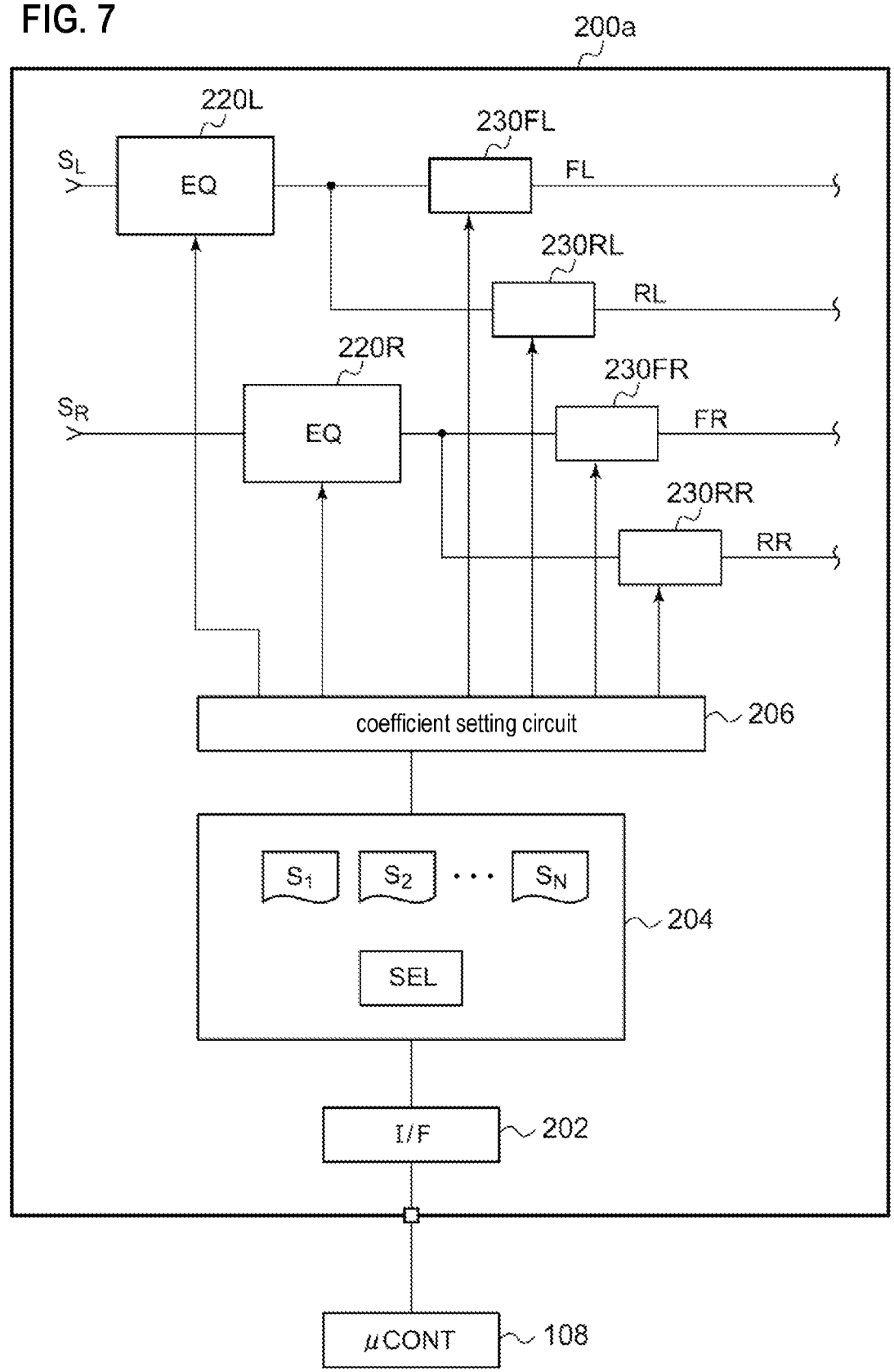
FIG. 7 is a block diagram of a DSP according to a third embodiment.

FIG. 7 is a block diagram of a DSP 200a according to a third embodiment. The DSP 200a is composed of, for example, two channels (L channel and R channel) which have multi-band equalizers 220L and 220R, respectively. Here, the DSP 200a is illustrated with a DSP for in-vehicle audio. An in-vehicle audio system has a total of 4 speakers, i.e., front left, front right, rear left and rear right. An output of the multi-band equalizer 220L is distributed to the front left and rear left speakers and an output of the multi-band equalizer 220R is distributed to the front right and rear right speakers.

The DSP 200a further includes delay circuits 230FL, 230RL, 230FR and 230 RR. These delay circuits 230 are variable delay circuits whose delay amount can be independently adjusted according to a delay setting value.

Although it is shown in FIG. 7, for the purpose of clarity, that one multi-band equalizer 220 is shared between the front and rear in each of the L channel and the R channel, the present disclosure is not limited thereto. In other words, the multi-band equalizer 220 may be provided individually for each of the front and rear, and therefore, the multi-band equalizer 220 may be provided for each speaker. This makes it possible to set a sound field with overflowing presence. Alternatively, only one common multi-band equalizer may be provided for all channels. As another alternative, one multi-band equalizer 220 shared by the front channel and the front R channel and one multi-band equalizer 220 shared by the rear L channel and the rear R channel may be provided.

Figure 8A:
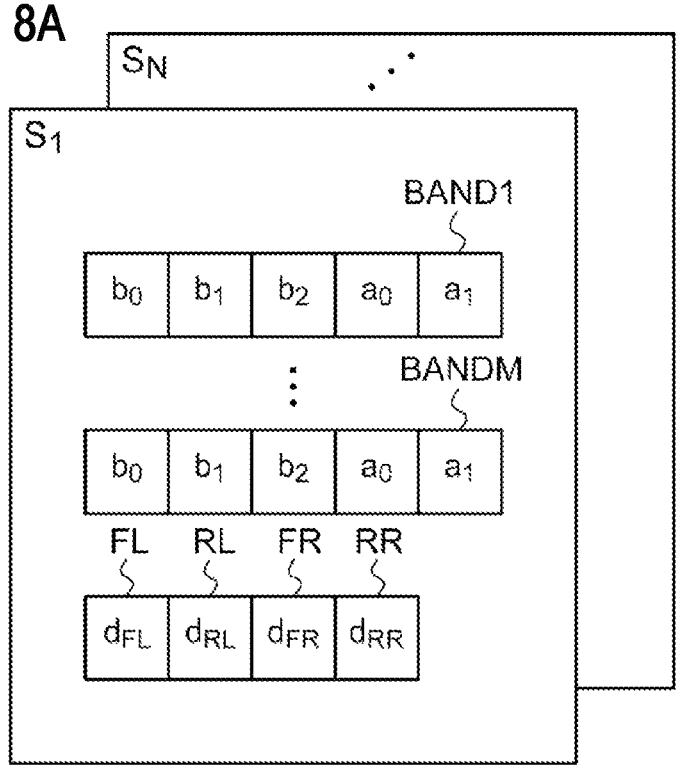
FIGS. 8A and 8B are views showing one example of setting data.
Figure 8B:
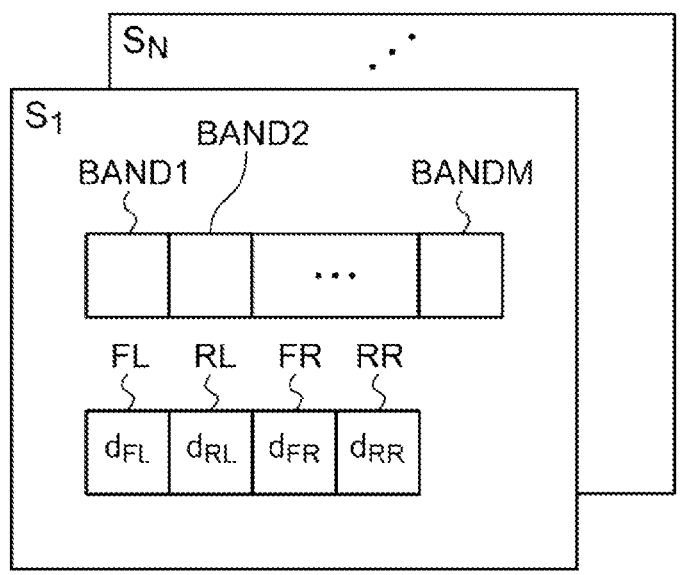

FIGS. 8A and 8B are views showing one example of setting data. Setting data $S_1$ includes delay setting values $D_{FL}$, $D_{RL}$, $D_{FR}$ and $D_{RR}$ for the plurality of delay circuits 230F 230RL, 230FR and 230RR, respectively, in addition to data for the multi-band equalizer 220. The setting data $S_1$ of FIG. 8A includes data for the multi-band equalizer 220 in the format of FIG. 4. The setting data $S_1$ of FIG. 8B includes the data for the multi-hand equalizer 220 in the format of FIG. 6A. In addition, in FIG. 7, when different frequency characteristics are set for the multi-band equalizer 220L and the multi-band equalizer 220R for the same preset, data for the multi-band equalizer 220L of the L channel and data for the multi-band equalizer 220R of the R channel may be included in the setting data $S_1$.

Subsequently, the operation of the DSP 200a will be described. In the setup sequence, the interface circuit 202 receives a plurality of setting data $S_1$ to $S_N$ corresponding respectively to a plurality of presets and holds them in the memory 204. When the interface circuit 202 receives the selection data SEL to designate a preset, the coefficient setting circuit 206 selects one setting data $S_i$ corresponding to the selection data SEL and sets the frequency characteristics of the multi-band equalizers 220L and 220R and the delay amounts of the delay circuits 230FL, 230RL, 230FR and 230RR based on the selected setting data $S_i$.

The above is the configuration and operation of the DSP 200a according to the third embodiment. According to the DSP 200a, it is possible to instantaneously switch a preset using a delay. For example, a preset related to a sound adjustment function can use a reverberation effect by delaying a sound from the rear speaker relative to a sound from the front speaker. According to the third embodiment, since the delay amount can be switched for each preset, it is possible to support presets related to acoustic adjustment and the like.

Alternatively, in car audio, distances between a viewing position (for example, a driver's seat) and four speakers are different from each other, and, when the speakers sound with the same phase, the phases thereof are shifted at the viewing position and a sound image is blurred. In room correction (also called a sound field correction or a fixed eraser) for correcting this, it is necessary to set different delay amounts for different speakers. According to the third embodiment, it is possible to select a preset in consideration of room correction.

APPLICABILITY

Figure 9:
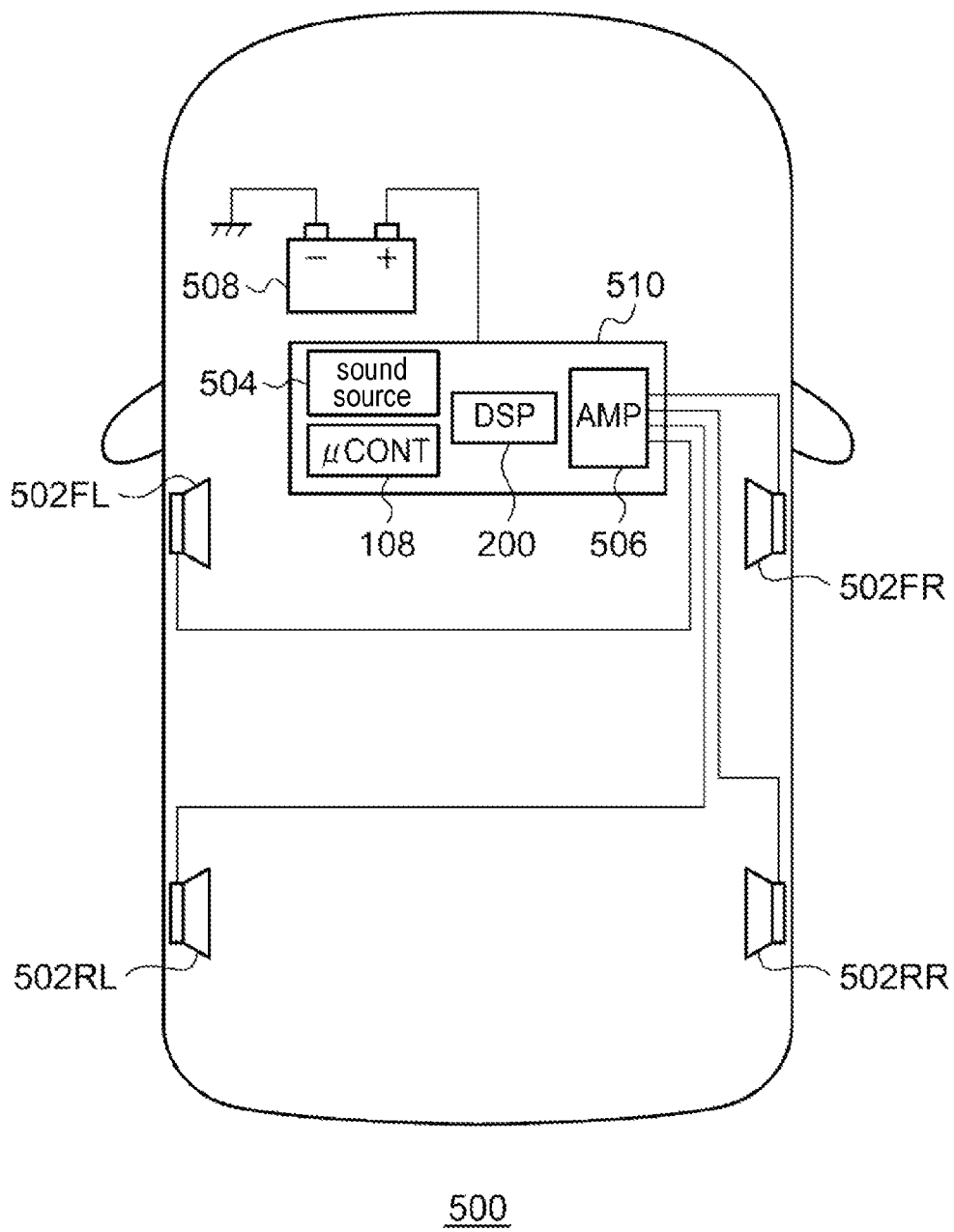
FIG. 9 is a block diagram showing the configuration of an in-vehicle audio system including a DSP.

Finally, applications of the DSP 200 will be described. FIG. 9 is a block diagram showing the configuration of an in-vehicle audio system 500 including the DSP 200. The in-vehicle audio system 500 is composed of four channels (front right FR, rear right RR, front left FL and rear left RL) and has a plurality of speakers 502FR, 502RR, 502FL and 502RL corresponding respectively to the four channels. The in-vehicle audio system 500 may be a 5.1 channel system further including a center channel and a subwoofer channel.

A sound source 504 is a CD player, a DVD player, a Blu-ray player, an HDD/silicon audio player, a radio tuner or the like and reproduces analog or digital audio signals. The DSP 200 receives an audio signal from the sound source 504 and performs various digital signal processing on the received audio signal. The audio signal subjected to the processing of the DSP 200 is converted into an analog audio signal which is then input to an amplifier 506. The amplifier 506 amplifies the analog audio signal of each channel and drives the corresponding speaker 502. The microcomputer 108 integrally controls the blocks including the DSP 200. The sound source 504, the microcomputer 108, the DSP 200 and the amplifier 506 operate with power supplied from a battery 508. The sound source 504, the microcomputer 108, the DSP 200 and the amplifier 506 may be incorporated in a head unit 510. In addition, the amplifier 506 may be integrated on the same chip as the DSP 200.

When a user (driver) turns on an ignition (or accessory on), power is supplied to circuits including the microcomputer 108. When the power is supplied, the process proceeds to the setup sequence and the setting data $S_1$ to $S_N$ are transmitted from the microcomputer 108 to the DSP 200.

The DSP 200 may also be mounted on electronic apparatuses such as an audio component device, a television, a desktop PC, a notebook PC, a tablet PC, a mobile phone terminal, a digital camera, a portable audio player, etc. in addition to the above-described in-vehicle audio system.

Figure 10A:
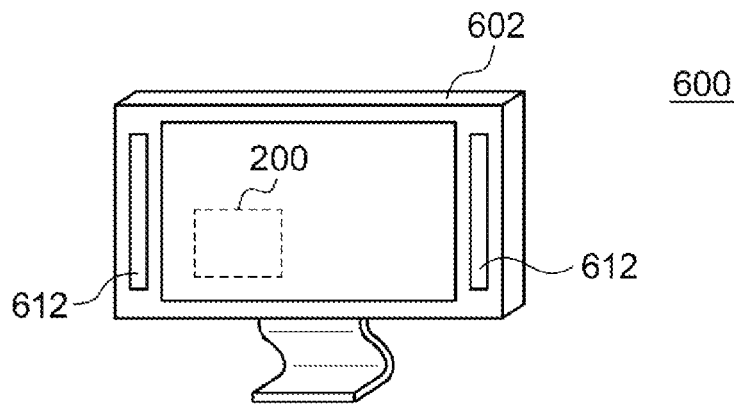
FIGS. 10A to 10C are external views of electronic apparatuses.
Figure 10B:
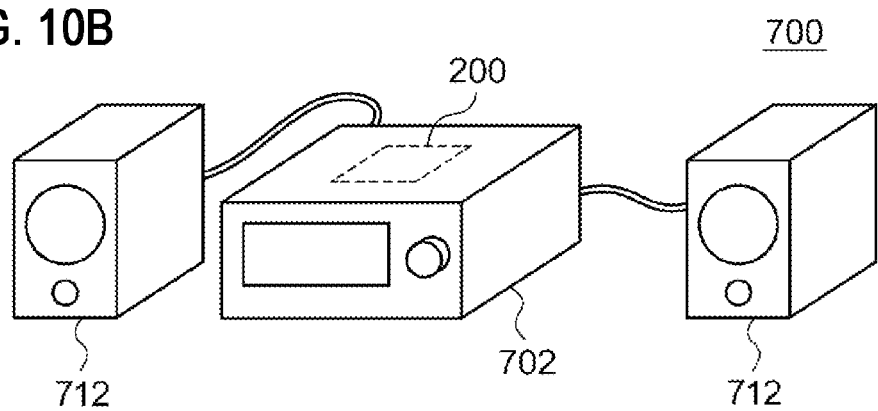
Figure 10C:
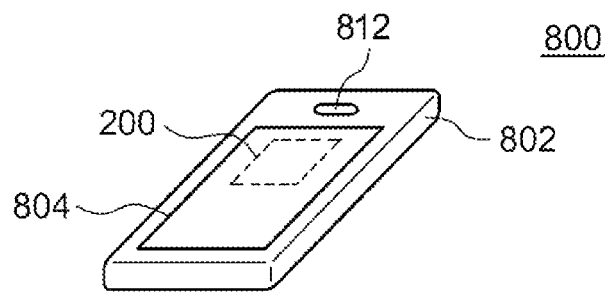

FIGS. 10A to 10C are external views of electronic apparatuses. FIG. 10A shows a display 600 which is one example electronic apparatus. The display 600 includes a housing 602 and a speaker 612. The DSP 200 is incorporated in the housing 602.

FIG. 10B shows an audio component device 700 which is one example of an electronic apparatus. The audio component device 700 includes a housing 702 and speaker 712. The DSP 200 is incorporated in the housing 702.

FIG. 10C shows a small information terminal 800 which is one example of an electronic apparatus. The small information terminal 800 is a mobile phone, a tablet terminal, an audio player, or the like. The small information terminal 800 includes a housing 802, a speaker 812 and a display 804. The DSP 20 is incorporated in the housing 802.

According to the present disclosure in some embodiments, it is possible to reduce the data amount of data transmission between a microcomputer and a DSP during audio reproduction.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A digital signal processor for audio, comprising:
an interface circuit configured to communicate with an external microcomputer;
a first multi-band equalizer which includes a plurality of digital filters corresponding respectively to a plurality of bands and is shared by a first front channel and a second front channel, wherein frequency characteristic of each of the digital filters in the first multi-band equalizer is changed according to a coefficient group;
a second multi-band equalizer which includes a plurality of digital filters corresponding respectively to a plurality of bands and is shared by a first rear channel and a second rear channel, wherein frequency characteristic of each of the digital filters in the second multi-band equalizer is changed according to the coefficient group;
first to fourth delay circuits each configured to provide a variable delay to an audio signal, the first delay circuit being disposed before or after the first multi-band equalizer on the first front channel, the second delay circuit being disposed before or after the first multi-band equalizer on the second front channel, the third delay circuit being disposed before or after the second multi-band equalizer on the first rear channel, and the fourth delay circuit being disposed before or after the second multi-band equalizer on the second rear channel;
a memory; and
a coefficient setting circuit configured to set the coefficient group of each of the digital filters,
wherein the frequency characteristic of each of the first multi-band equalizer and the second multi-band equalizer is selected from a plurality of presets,
wherein the interface circuit is configured such that, at the startup of the digital signal processor, the interface circuit receives a plurality of setting data corresponding respectively to the plurality of presets from the external microcomputer and stores the received plurality of setting data in the memory,
wherein the interface circuit is configured to receive selection data from the external microcomputer;
wherein the selection data designates one preset of the plurality of presets and corresponds to one setting data of the plurality of setting data stored in the memory at the startup of the digital signal processor;
wherein the coefficient setting circuit is configured to set the coefficient group of each of the plurality of digital filters according to the one setting data corresponding to the selection data,
wherein each setting data of the plurality of setting data respectively corresponding to the plurality of presets includes the coefficient group of each of the plurality of digital filters,
wherein the setting data includes a plurality of delay setting values respectively corresponding to the plurality of presets, and
wherein the coefficient setting circuit sets, during an audio reproduction, a delay amount of each of the first to fourth delay circuits according to the delay setting values included in the one setting data of the plurality of setting data stored in the memory.

2. The digital signal processor of claim 1,
wherein a frequency of each of the plurality of bands is fixed,
wherein each of the plurality of setting data includes a gain of each of the plurality of bands, and
wherein the coefficient setting circuit holds a correspondence between the gain and a coefficient group of the corresponding digital filter for each of the plurality of bands.

3. The digital signal processor of claim 1, wherein the digital signal processor is integrated on a single semiconductor substrate.

4. The digital signal processor of claim 1, wherein the plurality of presets is set to delay sounds from the first rear channel and the second rear channel relative to sounds from the first front channel and the second front channel.

5. An in-vehicle audio system comprising a digital signal processor of claim 1.

6. An electronic apparatus comprising a digital signal processor of claim 1.

* * * * *